United States Patent [19]

Asplund et al.

[11] Patent Number: 5,371,651
[45] Date of Patent: Dec. 6, 1994

[54] POWER SEMICONDUCTOR VALVE DEVICE FOR OUTDOOR LOCATION

[75] Inventors: Gunnar Asplund, Ludvika; Urban Åström, Saxdalen; Bjorn Sandin, Ludvika, all of Sweden

[73] Assignee: Asea Brown Boveri AB, Västerås, Sweden

[21] Appl. No.: 117,124

[22] PCT Filed: Jan. 27, 1993

[86] PCT No.: PCT/SE93/00053
§ 371 Date: Sep. 22, 1993
§ 102(e) Date: Sep. 22, 1993

[87] PCT Pub. No.: WO93/17488
PCT Pub. Date: Sep. 2, 1993

[30] Foreign Application Priority Data

Feb. 28, 1992 [SE] Sweden ............................... 9200601

[51] Int. Cl.$^5$ ............................................. H05K 7/20
[52] U.S. Cl. ........................................ 361/689; 361/677; 361/690
[58] Field of Search .................. 174/15.1, 151.3, 16.3; 361/676–678, 689–690, 694–695, 698–699, 831

[56] References Cited

U.S. PATENT DOCUMENTS 3,989,884 11/1976 Friedrich et al. .................. 174/15.6
4,818,319 4/1989 Beer et al. ............................ 156/192

FOREIGN PATENT DOCUMENTS 0196493 10/1986 European Pat. Off. .
63-80763 9/1986 Japan .

Primary Examiner—Gregory D. Thompson
Attorney, Agent, or Firm—Watson, Cole, Grindle & Watson

[57] ABSTRACT

A power semiconductor valve device including an enclosure for semiconductor components and a hollow insulating body to supply power to the semiconductor components from a remote location, in which the hollow insulating body is formed from a non-ceramic material and includes concentrically mounted tubes spaced from each other to provide an annular gap between them.

10 Claims, 5 Drawing Sheets

POWER SEMICONDUCTOR VALVE DEVICE FOR OUTDOOR LOCATION

TECHNICAL FIELD

The present invention relates to a power semiconductor valve device for outdoor location in an enclosure which is electrically insulated against the surroundings. By power semiconductor valve device, in the following abbreviated to "valve device", is meant in this application a device comprising one or more power semiconductor valves located in a common enclosure. By power semiconductor valve is meant a set of one or more, controllable or non-controllable, power semiconductor components, for example thyristors or diodes, which electrically function as a unit.

BACKGROUND ART

It is known to place valve devices, for example thyristor valves included in plants for series compensation of a.c. lines or for conversion between alternating current and high-voltage direct current, in enclosures suited for outdoor erection, these enclosures being electrically insulated against the surroundings by being located on support insulators of porcelain. It is also known from Japanese patent application JP 63-80763 (A) to pass a light guide to a thyristor valve, located indoors and erected in an insulating manner, by arranging the light guide inside a hollow porcelain insulator filled with SF6 gas. By supplying the valve device with control signals and other media via a separate insulator, possibilities are opened for separately designing both this separate insulator and the support insulators in an optimum manner in view of their respective functions.

An insulator adapted for supply of control signals must in general be designed with a larger diameter than the support insulators, and particularly in those cases where it is additionally utilized for supply and/or removal of temperature-influencing media for the valve device and/or the insulating medium of the valve device. A porcelain insulator for this purpose is therefore usually heavy and difficult to manufacture, particularly in the lengths which may be required for high-voltage plants. Particularly in plants for high-voltage direct current, it must also be taken into consideration that the risk of flashover across the insulators is greatly depending on deposits on the insulator surfaces, and therefore it is desirable with a hydrophobic insulator surface in the case of outdoor location. The internal dielectric strength of the insulator is negatively influenced by the channels and conductors which are placed therein for the purposes stated above, so it is important that the risk of condensation and the ensuing risks of flashover are minimized by control of the climate in the interior of the insulator.

SUMMARY OF THE INVENTION

The invention aims to provide a valve device of the kind described in the introduction, the supply of which with information-carrying signals and/or of media for influencing the temperature of the valve device and/or the insulating medium of the valve device takes place by an insulator which exhibits good electrical and thermal insulating properties and which is simple to manufacture in large lengths.

What characterizes a valve device according to the invention will be clear from the appended claims.

BRIEF DESCRIPTION OF THE DRAWINGS

The invention will be explained in greater detail by describing embodiments with reference to the accompanying drawings, wherein.

DESCRIPTION OF THE PREFERRED EMBODIMENTS

Figure 1:
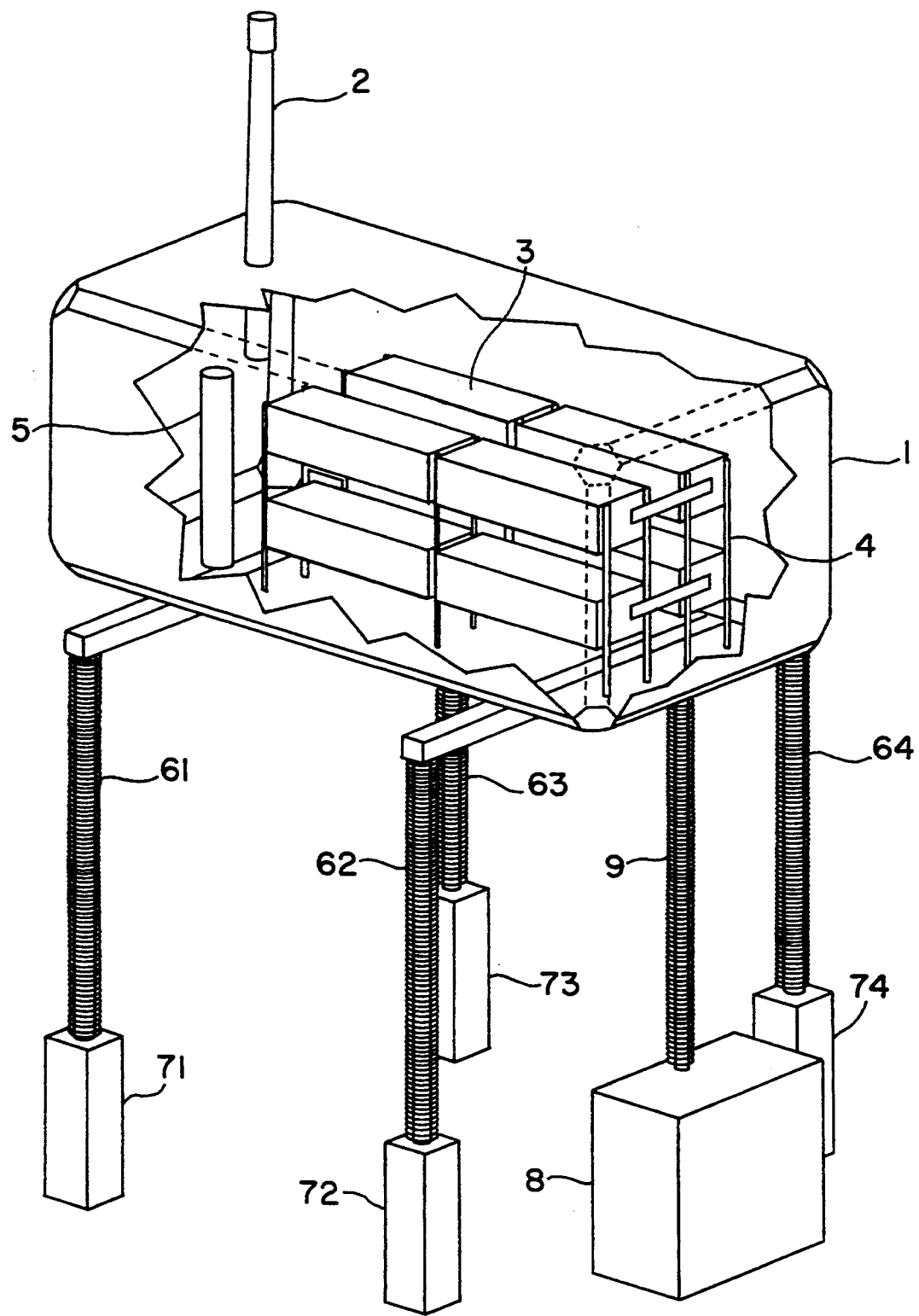
FIG. 1 shows a valve device according to the invention.

FIG. 1 shows a partially cut-away enclosure 1 for a thyristor valve included in a plant for transmission of high-voltage direct current. The enclosure comprises a body of a steel framework (not further shown), which supports a double-walled casing of sheet metal. Between the sheets, a layer of mineral wool has been placed as thermal insulation. A bushing 2 is intended for connection of the thyristor valve to an a.c. line (not shown). In the enclose a number of thyristors are arranged in a total of eight modules 3, one being marked in the figure. The modules are arranged on insulating module supports 4 (only indicated) and the enclosure also comprises a surge arrester 5 for protection against overvoltages. The enclosure is mounted on four support insulators 61, 62, 63, 64 of porcelain, each one resting on a concrete plinth 71, 72, 73, 74. Between the enclosure and a box 8 at ground level, a communication insulator 9 is arranged.

Figure 2:
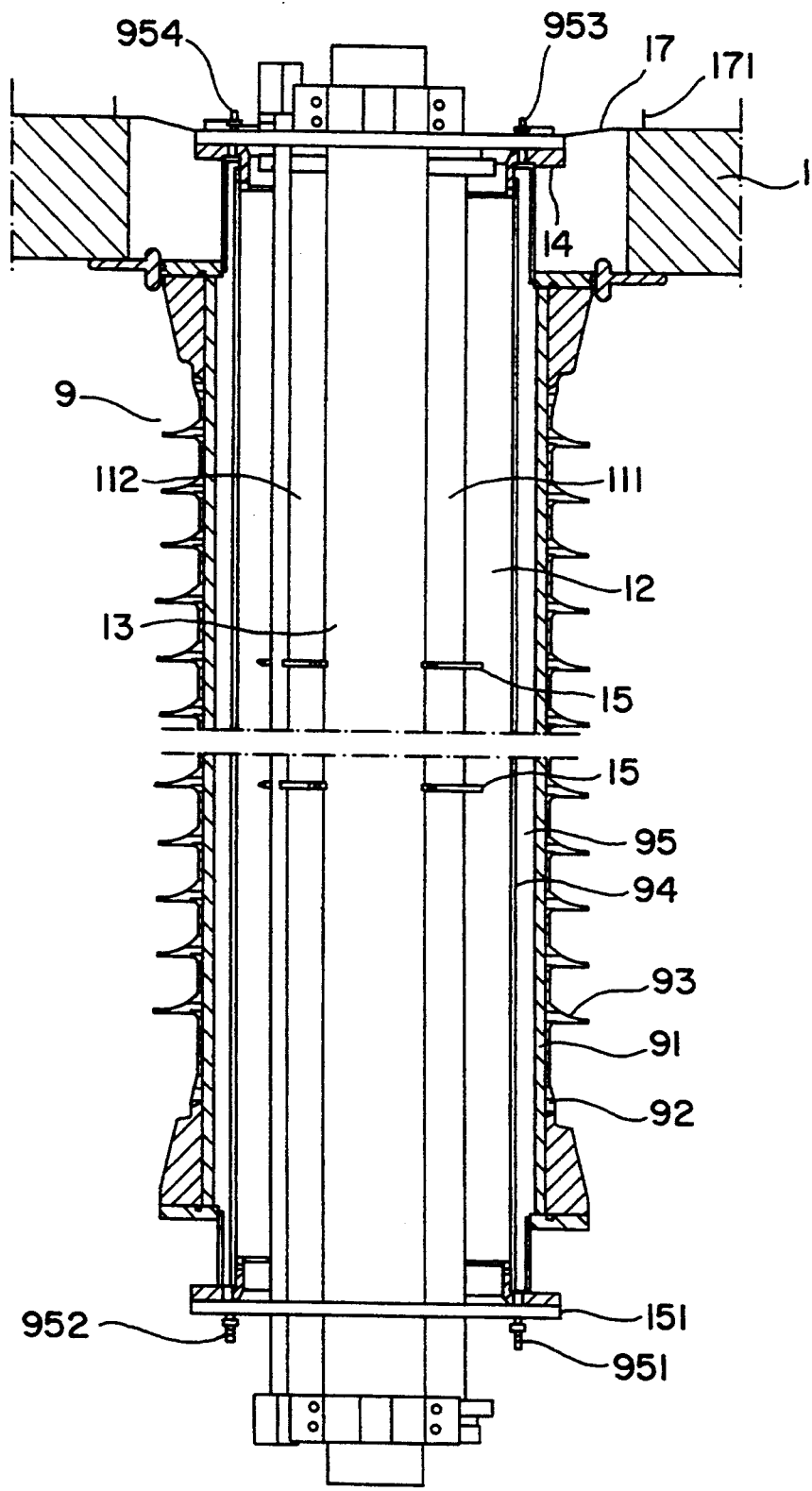
FIG. 2 shows a vertical section of a communication insulator according to the invention.
Figure 3:
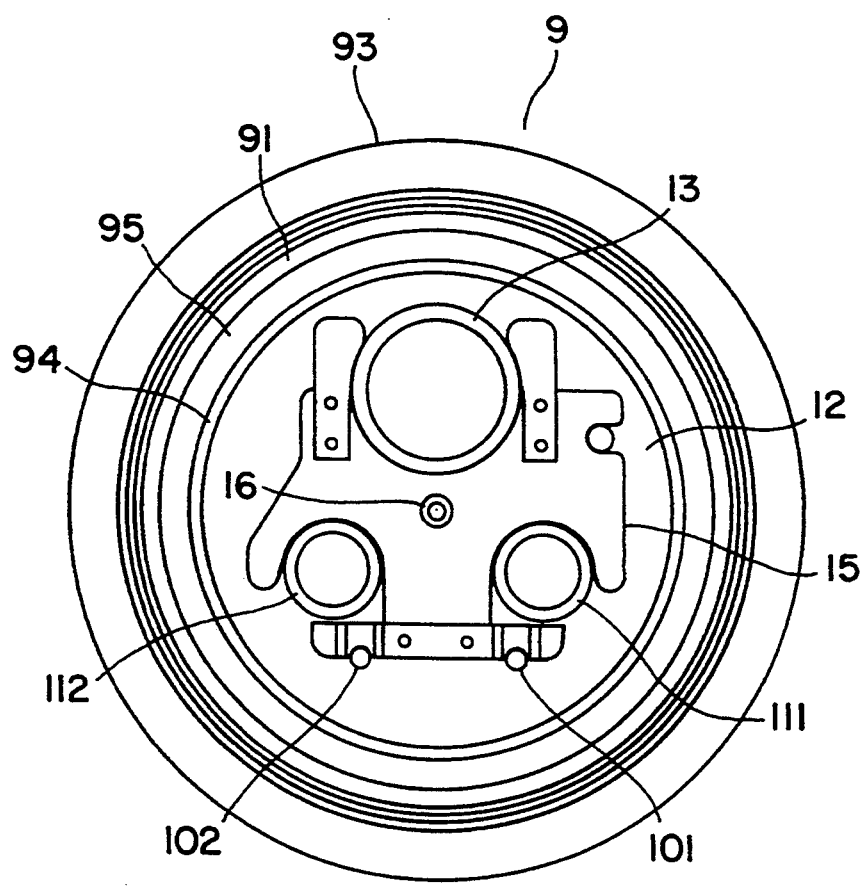
FIG. 3 shows a horizontal section of a communication insulator according to FIG. 2.

The communication insulator will be described in greater detail with reference to FIGS. 2 and 3, in which it is shown in vertical and horizontal sections, respectively. The communication insulator comprises a first insulator tube 91 of glass-fibre reinforced plastic on which a casing 92 of silicone rubber is arranged. The casing exhibits grooves 93 for achieving a longer creep distance over the insulator. A second insulator tube 94 of glass-fibre reinforced plastic is arranged concentrically with the first insulator tube inside the communication insulator such that an annular gap 95 is formed between the two insulator tubes. From the ground box 8 control signals are supplied, in a manner known per se, to the thyristors arranged in the enclosure via light guides 101, 102 passing through the communication insulator. A first and a second cooling liquid tube 111, 112 of crosslinked polyethylene, so-called PEX, conduct a cooling liquid, consisting of a mixture of water and propylene glycol, for the thyristors to and from the enclosure, respectively. The insulating medium of the valve device consists of air and for the purpose of controlling the temperature and moisture of the air, the enclosure communicates, via the communication insulator, with an air-conditioning plant located outside the enclosure. The insulating medium flows from the enclosure through the inner part 12 of the second insulator tube to a heat exchanger, included in the air-conditioning plant, and back to the enclosure through a ventilating tube 13 of crosslinked polyethylene arranged in the insulator. The air flow is driven by a fan included in the air-conditioning plant. The purpose of the annular gap 95 is to thermally insulate the interior of the communication insulator against the surroundings. Since the outer limiting surface of the annular gap faces the surroundings and consequently, at least at low outdoor temperatures, a risk of the formation of condensation exists, a small amount of air is discharged at the lower part of the communication insulator, in a manner not shown in the figures, which air is dried in a drying device arranged in a known manner, for example with silica gel, and thereafter via lower nipples 951, 952 and upper nipples 953, 954, is conducted through the annular gap up to the enclosure. This air flow is driven by the overpressure in relation to the enclosure which exists at the lower part of the communication insulator because of the flow conditions.

The light guides 101, 102, the cooling liquid tubes 111, 112 and the ventilating tube 13 are attached to an upper flange 14 and fixed in the radial direction to a number of support plates 15 arranged at a suitable axial distance from each other around a rod 16 of glass-fibre reinforced plastic passing through the communication insulator. The rod is also attached to the upper flange 14 which rests or the insulator tubes 91, 94 such that the light guides, the cooling liquid tubes and the ventilating tube in the communication insulator will be suspended from the insulator tubes. The flange is provided with openings and bushings (not shown in the figures) for the above-mentioned light guides and the liquid and gas flows. At the lower part of the communication insulator a guide plate 151 for the cooling liquid tubes and the ventilating tube is arranged, and the communication insulator is provided, in a manner known per se, with seals and connections to the enclosure and the ground box. Between the upper flange 14 of the communication insulator and the enclosure 1, an annular cloth 17 of rubber is arranged. At its outer periphery the cloth 17 exhibits a flange 171 which, in the event of a major breakdown in the cooling system of the thyristor valve, forms a spillway whereby leaking cooling liquid will run down through the interior of the communication insulator to a collection system arranged at ground level. Both at its upper and lower ends the communication insulator is provided with fire slide valves (not shown in the figures) which are automatically closed in case of alarm from a smoke detector located in the air flow from the enclosure. A possible fire in the enclosure will thus be rapidly smothered, which makes it possible to design the box such that fires do not spread to other parts of the plant. The air-conditioning plant comprises two two-way nonreturn valves which, at a predetermined pressure respectively above and below atmospheric pressure in the enclosure, are opened and put the interior of the enclosure in connection with the surrounding atmosphere.

The invention is not limited to the embodiments shown but a plurality of modifications are feasible within the scope of the inventive concept. Thus, it can be utilized to advantage in plants for, for example, series compensation and for static voltage compensation in a.c. lines. It is, of course, also applicable to other insulating media in the enclosure, such as, for example, nitrogen gas or SF6 gas. The communication insulator can also be manufactured in other composite materials or, for example, wholly or partially of cross-linked polyethylene, so-called PEX. To the extent that environmental factors and the design of the communication insulator allow, it is not necessary to form the annular gap 95 but in those cases where this gap is formed, its insulating effect can also be achieved by filling it with some heat-insulating material, for example mineral wool.

In those cases where the enclosure is included in a complete converter, it is advantageous, in view of the voltage distribution, to arrange the channels for the coolant of the valve device directly between the enclosures included in the converter, and therefore, in this case, the communication insulator arranged between ground potential and the enclosure only comprises light guides and ventilating tubes. In these cases, it may also be advantageous to arrange in the communication insulator a separate tube for cooling liquid which runs over the spillway. Also in those cases where the enclosure is arranged suspended from, for example, a framework structure, a communication insulator according to the invention, arranged for the above-described purposes, is applicable.

By using an insulating body of a non-ceramic material for arranging the supply of the above-mentioned valve device with information-carrying signals and/or of media for influencing the temperature of the power semiconductors or the insulating medium of the valve device, advantages in the form of good electrical and thermal insulating properties are obtained in that non-ceramic material suited for insulators has or can be provided in a simple manner with a hydrophobic surface. As mentioned in the introduction, this is of great importance, particularly in plants for high-voltage direct current. Since channels and conductors arranged in the interior of an insulating body according to the invention have a negative influence on the internal dielectric strength, it is advantageous, when the body is placed in an outdoor environment, also to make the internal surface of the body hydrophobic. An insulating body according to the invention can also simply be designed with double walls for good thermal insulation. Further, it becomes lighter than a corresponding ceramic insulator and simple to manufacture in large lengths without joints.

Figure 4:
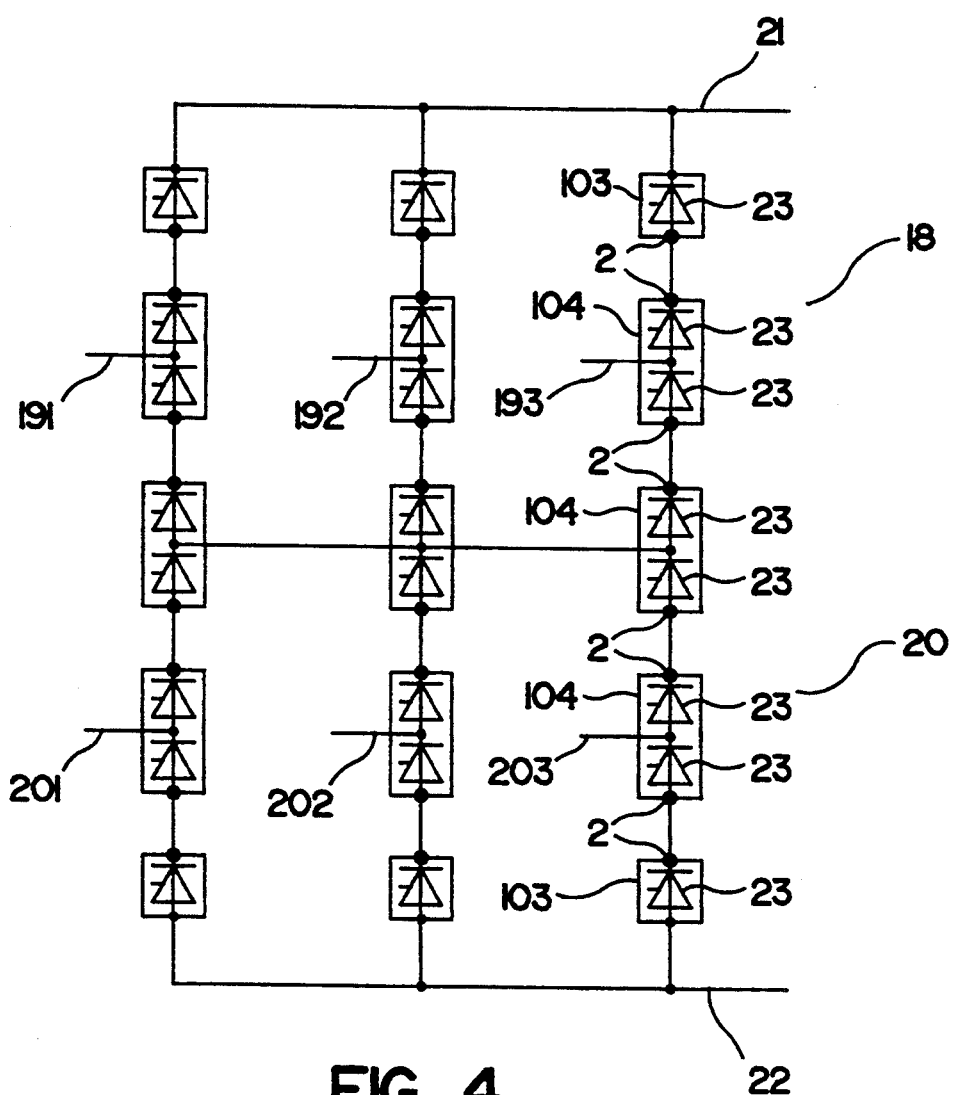
FIG. 4 shows the main circuits for a 12-pulse converter according to an advantageous embodiment of the valve device.
Figure 5:
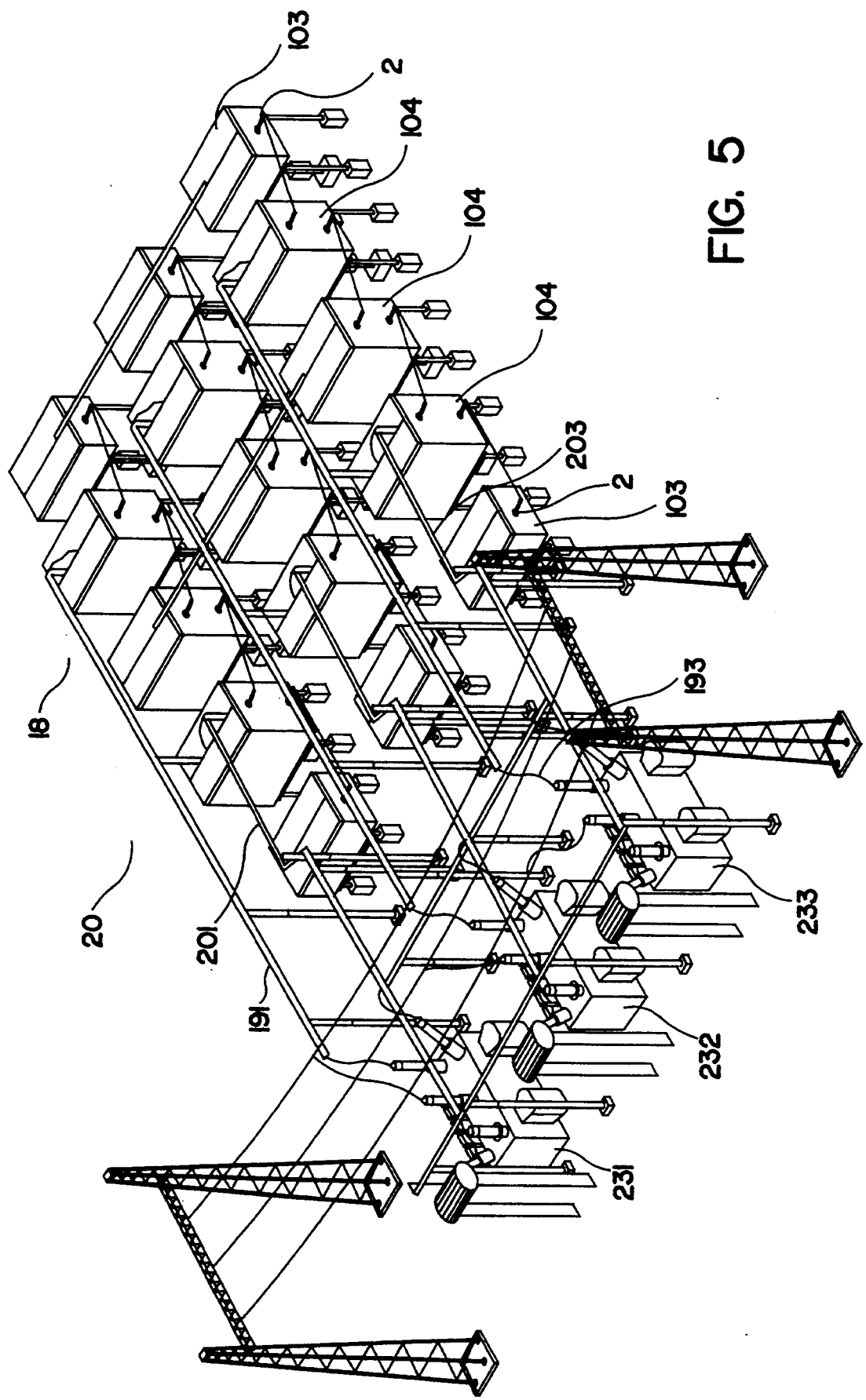
FIG. 5 shows an overall view of the converter according to FIG. 4.

In an advantageous embodiment of the valve device, the power semiconductors included in the plant are arranged in groups, each of which forms a so-called half-valve. This is illustrated in FIG. 4 which shows the main circuits for a 12-pulse converter for conversion of an alternating current to high-voltage direct current. The upper six-pulse group 18 of the converter is supplied in a known manner with a three-phase alternating voltage via three conductors 191, 192, 193, and the lower six-pulse group 20 of the converter is supplied with a corresponding voltage with a 30° phase shift via three other conductors 201, 202, 203. To the converter are connected a pole line 21 and a neutral line 22. The thyristor elements included in the converter are grouped in a number of half-valves 23, which are enclosed in respectively, a first type of enclosures 103 comprising one half-valve and a second type of enclosures 104 comprising two half-valves. Otherwise, both types of enclosures are of the same design as that described above. In the first type of enclosures, one terminal of the half-valve is connected to the enclosure and to the respective pole and neutral lines whereas the other terminal of the half-valve extends, via a bushing 2, out through the enclosure in the manner illustrated in FIG. 1. To reduce the number of enclosures with associated support insulators and base plates, the other type of enclosures comprises two series-connected half-valves. For the purpose of reducing the requirements for insulation distance in the enclosure, the point where the two half-valves are series-connected is also connected electrically to the enclosure whereas the other two terminals of the half-valves extend out through the enclosure via bushings 2. Since the half-valve which is located nearest the pole and neutral lines, respectively, of the converter is accomodated in an enclosure of the first type, a more uniform voltage stress on individual thyristors is obtained with this embodiment in that stray capacitances between the enclosure and the internal live parts and between the enclosure and ground, respectively, do not contribute to an uneven distribution of the voltage as the case will be if the converter is built up of enclosures of the second type only. In addition to this, the number of enclosures for a complete plant is reduced and the dimensions of the enclosure, in those cases where it comprises two half-valves, are minimized. A general view of a converter according to FIG. 4 is shown in FIG. 5. This figure shows how, in a known manner, three single-phase transformers 231, 232, 233, each one with two secondary windings, each supplies one phase of the converter. The elements marked in FIG. 4 are marked in FIG. 5 with the same reference numerals, although, for the sake of clarity, not all of the mutually identical elements are marked.

We claim:

1. A power semiconductor valve device including power semiconductor components for outdoor location in an enclosure therefor, said enclosure being mounted on insulators that are electrically insulated to the surroundings, and a hollow insulating body connected to said enclosure and extending thereto from a remote location, said hollow body being adapted to supply said enclosure and said power semiconductor components with information-carrying signals and/or an insulating medium and/or media for influencing the temperature of said components, characterized in that said hollow insulating body is formed from a non-ceramic material and comprises a first insulator tube and a second insulator tube is mounted substantially concentrically within said first tube so that there is an annular gap formed between said tubes.

2. A power semiconductor valve device according to claim 1, characterized in that said annular gap is adapted to allow the flow of gas or liquid through the gap and between the enclosure and the surroundings.

3. A power semiconductor valve device according to claim 1, characterized in that the annular gap is filled with a heat-insulating material.

4. A power semiconductor valve device according to claim 1, characterized in that at least the first insulator tube is of a composite material.

5. A power semiconductor valve device according to claim 1, characterized in that at least the first insulator tube is of cross-linked polyethylene.

6. A power semiconductor valve device according to claim 1, characterized in that channels for supply and/or discharge of a coolant for the power semiconductor components are arranged within said second insulator tube.

7. A power semiconductor valve device according to claim 1, characterized in that light guides for supply of control signals to the power semiconductor components are arranged within said second insulator tube.

8. A power semiconductor valve device according to claim 1, characterized in that channels for supply and/or discharge of the insulating medium of the valve device are arranged within said second insulator tube.

9. A power semiconductor valve device according to claim 1, characterized in that the insulating body is a rigid body provided with grooves and standing between the ground and the enclosure.

10. A power semiconductor valve device according to claim 9, wherein the device rests on support insulators, characterized in that the insulating body is separated from said support insulators.

* * * * *